United States Patent
Mula et al.

(10) Patent No.: US 9,344,117 B2
(45) Date of Patent: May 17, 2016

(54) METHODS AND SYSTEMS FOR ERROR-CORRECTION DECODING

(71) Applicant: Mellanox Technologies Ltd., Yokneam (IL)

(72) Inventors: Liron Mula, Ramat Gan (IL); Ran Ravid, Tel Aviv (IL); Chen Gaist, Tel Aviv (IL); Omer Sella, Timrat (IL); Oren Tzvi Sela, Rosh Pina (IL)

(73) Assignee: Mellanox Technologies, Ltd., Yokneam (IL)

( * ) Notice: Subject to any disclaimer, the term of this patent is extended or adjusted under 35 U.S.C. 154(b) by 118 days.

(21) Appl. No.: 13/839,193

(22) Filed: Mar. 15, 2013

(65) Prior Publication Data

US 2014/0281840 A1 Sep. 18, 2014

(51) Int. Cl.
*H03M 13/00* (2006.01)
*H03M 13/15* (2006.01)
*H03M 13/37* (2006.01)

(52) U.S. Cl.
CPC ........ *H03M 13/1515* (2013.01); *H03M 13/153* (2013.01); *H03M 13/1575* (2013.01); *H03M 13/3715* (2013.01)

(58) Field of Classification Search
None
See application file for complete search history.

(56) References Cited

U.S. PATENT DOCUMENTS

| | | | | |
|---|---|---|---|---|
| 4,637,021 A * | 1/1987 | Shenton | | H03M 13/15 714/756 |
| 5,615,221 A * | 3/1997 | Karp et al. | | 714/752 |
| 5,627,843 A * | 5/1997 | Deng | | G11B 20/1833 714/785 |
| 7,689,893 B1 | 3/2010 | Burd | | |
| 7,877,665 B2 * | 1/2011 | Mokhlesi | | 714/763 |
| 8,065,593 B2 | 11/2011 | Nee et al. | | |
| 8,190,963 B1 | 5/2012 | Wu et al. | | |
| 8,281,212 B1 | 10/2012 | Yeung et al. | | |
| 8,296,635 B2 | 10/2012 | Au et al. | | |
| 8,301,986 B2 | 10/2012 | Jo et al. | | |
| 8,347,194 B2 | 1/2013 | No et al. | | |
| 8,429,498 B1 * | 4/2013 | Anholt et al. | | 714/764 |
| 8,627,175 B2 * | 1/2014 | Patapoutian et al. | | 714/763 |
| 8,645,789 B2 * | 2/2014 | Sharon et al. | | 714/755 |
| 8,812,939 B2 * | 8/2014 | Yang et al. | | 714/782 |
| 2007/0016839 A1 * | 1/2007 | Chiou | | 714/774 |
| 2009/0282319 A1 * | 11/2009 | No et al. | | 714/780 |
| 2010/0253555 A1 | 10/2010 | Weingarten et al. | | |
| 2010/0332942 A1 * | 12/2010 | Wezelenburg et al. | | 714/763 |
| 2011/0197109 A1 * | 8/2011 | Kanno et al. | | 714/773 |
| 2011/0320902 A1 * | 12/2011 | Gunnam | | 714/752 |

FOREIGN PATENT DOCUMENTS

TW 201015562 4/2010

* cited by examiner

*Primary Examiner* — Justin R Knapp
(74) *Attorney, Agent, or Firm* — Finnegan, Henderson, Farabow, Garrett & Dunner, LLP (57) ABSTRACT

Methods and systems for efficient Reed-Solomon (RS) decoding are provided. The RS decoding unit includes both an RS pseudo decoder and an RS decoder. The RS pseudo decoder is configured to correct a small number of errors in a received codeword, while the RS decoder is configured to correct errors that are recoverable by the RS code. The RS pseudo decoder runs in parallel with the RS decoder. Once the RS pseudo decoder successfully decodes the codeword, the RS decoder may stop its processing, thereby reducing the RS decoding latency.

18 Claims, 5 Drawing Sheets

METHODS AND SYSTEMS FOR ERROR-CORRECTION DECODING

TECHNICAL FIELD

The present disclosure relates to the field of error-correction codes (ECC) and, more particularly, methods and systems for Reed-Solomon (RS) error-correction decoding.

BACKGROUND

Error-correction codes (ECC) are important building blocks in the low layer of the open systems interconnection (OSI) model. Many communication channels are subject to channel noise, and thus errors may be introduced during transmission from a source to a receiver. Error-correction codes can correct the introduced errors and enable reliable delivery of digital data over such unreliable communication channels.

In the field of error-correction codes, the Reed-Solomon (RS) codes have a wide range of applications in digital communications and storage. RS codes are used to correct errors in many systems, including, storage devices, wireless or mobile communications, satellite communications, digital television, high-speed modems, etc. The number and types of errors that can be corrected depend on the characteristics of the RS codes.

Due to the complex nature of the RS codes, the encoding, and more particularly, the decoding of the RS codes consume considerable time and computational resources. The time consumed to decode a RS code generally increases with the correction power of the RS code. Continual demand for higher data rates and storage capacity makes high-speed implementations of RS decoders desirable.

SUMMARY

Consistent with disclosed embodiments, there is provided a method for error-correction decoding. The method comprises receiving an encoded codeword, performing a first decoding process using a first decoder, the first decoder configured to correct no more than a predetermined number of errors, and performing a second decoding process using a second decoder, the second decoder configured to correct more than the predetermined number of errors. The method may further comprise generating a decoded message by the first decoding process, and aborting the second decoding process. The method may also comprise generating a decoded message by the first decoding process and starting decoding another received codeword. In addition, the method may comprise generating a decoded message by the second decoding process, wherein the first decoding process determines that the received codeword includes more than the predetermined number of errors.

Consistent with disclosed embodiments, the first decoder may be a Reed-Solomon (RS) pseudo decoder and the second decoder may be an RS decoder. The first decoder may be configured to correct one or two symbol errors in the received codeword. The first decoder may compute one or more syndrome values and identifies one or two errors associated with the received codeword based on the syndrome value. The first decoding process may consume less time than the second decoding process. The second decoder may be based on a Berlekamp-Massey algorithm. The first decoding process and the second decoding process may be performed in parallel. The first decoder and the second decoder may be integrated in a single chip.

Consistent with disclosed embodiments, there is also provided an error-correction decoding unit comprising: a first decoder for performing a first decoding process based on a received codeword, the first decoder configured to correct no more than a predetermined number of errors, and a second decoder for performing a second decoding process based on the received codeword, the second decoder configured to correct more than the predetermined number of errors.

It is to be understood that both the foregoing general description and the following detailed description are exemplary and explanatory only and are not restrictive of the invention, as claimed.

DETAILED DESCRIPTION

The present disclosure relates to methods, systems, and apparatuses for improved Reed-Solomon (RS) error-correction decoding with reduced latency. An RS decoder employs iterative algorithms, such as Berlekamp-massey algorithm, and is capable to correct errors that are recoverable by the RS code. For example, a RS(n, k) code with m-bit symbols can correct up to $t=(n-k)/2$ symbol errors, where n represents the number of encoded symbols in a block, and k represents the number of original message symbols. An RS decoder would be able to correct up to t symbol errors in a codeword. However, the RS decoder is time consuming for error correction as the error correction time is linearly increased with its correction power. That is, the RS decoder with capability to correct t symbol errors consumes longer decoding time than that of an RS decoder with capability to correct symbol errors less than t. The relatively long latency of RS decoding is particularly undesirable for high data rate communication systems as well as applications with stringent latency requirements.

To reduce latency of a RS decoding process, a RS pseudo decoder is implemented. The RS pseudo decoder is capable of detecting and correcting a small number of symbol errors, which is less than that of the RS decoder. The RS pseudo decoder is running in parallel with the RS decoder. When the received codeword contains a small number of symbol errors, the RS pseudo decoder is able to detect and correct the errors in a short amount of time and/or with lower complexity. When the received codeword contains a relatively large number of symbol errors and the RS pseudo decoder is unable to correct them, the RS pseudo decoder will indicate failure of decoding and the RS decoder will be able to detect and correct the errors. The RS pseudo decoder allows the decoding process to be finished quicker when the number of errors in the received codeword is small, while the maximum correcting power of the RS decoder is maintained by the RS decoder.

Reference will now be made in detail to the example embodiments that are illustrated in the accompanying drawings. Wherever possible, the same reference numbers will be used throughout the drawings to refer to the same or like parts.

Figure 1:
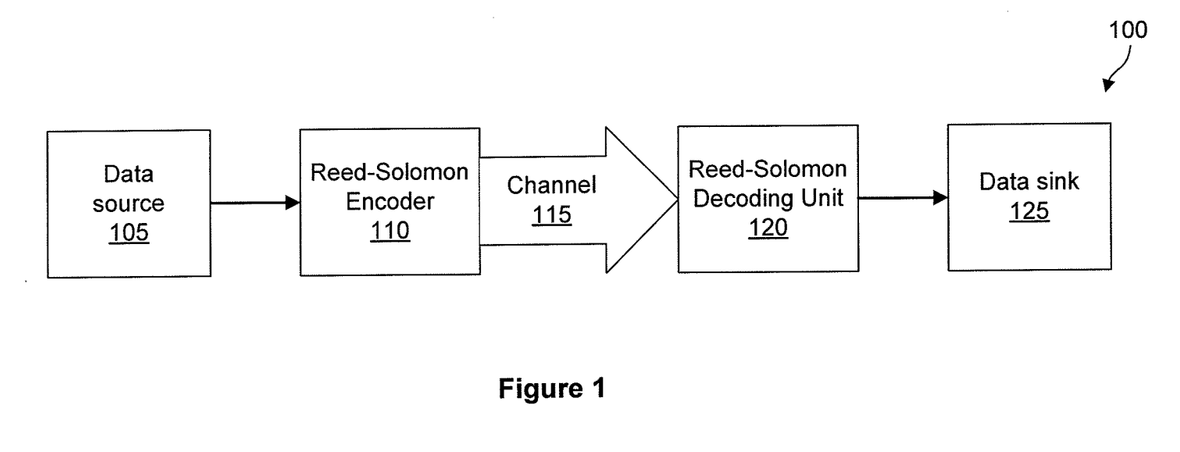
FIG. 1 illustrates a functional block diagram of an example error correcting system employing an RS code consistent with the present disclosure.

FIG. 1 illustrates a functional block diagram of an example error correcting system 100 employing RS code. The error correcting system 100 may include data source 105, Reed-Solomon encoder 110, channel 115, Reed-Solomon decoding unit 120, and data sink 125. The data source 105 provides a message which may be desired to transmit or to store e.g., in a flash memory, to the RS encoder 110. The RS encoder 110 computes and adds redundancy bits to the message, thereby generating a RS codeword with known parameters. For example, the RS encoder 110 may convert a k-symbol message into an n-symbol codeword of greater length. Each symbol is of m bits, where $2^m > n$. Such RS code may be referred to as a RS (n, k) code. RS(n, k) is referred to as a systematic code if the n-symbol codeword contains the original k-symbol message. The additional (n−k) symbols in the codeword are referred to as parity symbols. For example, a RS(255, 239) code takes in 239 symbols and adds 16 parity symbols such that there are 255 symbols in an encoded codeword.

A Reed-Solomon codeword is generated using a polynomial. All valid codewords are divisible by the polynomial. The general form of the polynomial is: $g(x)=(x-\alpha^{b_0})(x-\alpha^{b_0+1}) \ldots (x-\alpha^{b_0+2t-1})$, where $b_0$ is any arbitrary integer. The codeword is constructed using: $c(x)=g(x) \cdot m(x)$, where $g(x)$ is the generator polynomial, $m(x)$ is the message block, $c(x)$ is a valid codeword and $\alpha$ is referred to as a primitive element of the field. The 2t parity symbols in a systematic Reed-Solomon codeword are given by: $p(x)=m(x) \cdot x^{n-k} \mod g(x)$.

The encoded codeword is subsequently transmitted in channel 115. Channel 115 may include any signal-bearing medium through which the message is conveyed from the RS encoder 110 to the RS decoder 120. For example, the channel 115 may refer to a wired/wireless communication path between the RS encoder 110 and the RS decoder 120. The signal-bearing medium can be, for example, copper wire, coaxial cable, optical fiber, a magnetic disk drive, an optical disk drive, air, or other medium. The signal occurring on the signal-bearing medium can be based on magnetic, electrical, optical, and/or acoustic technology. Channel 115 may also refer to storage and read components of a disk drive, including a magnetic storage medium, a disk-drive read/write head, and other storage system components. Typically channel 115 will add errors to the encoded codeword due to interference signals, thermal noises, and other error-producing phenomena in a channel.

The resulting codeword after transmitting through the channel is referred to as the received codeword and is input to the RS decoding unit 120. The received codeword may contain errors compared to the original encoded codeword as a result of the corruption by the channel. Thus, the task of the RS decoding unit 120 is to recover the original message from the received codeword. For a RS (n,k) code, the RS decoding unit 120 is capable of correcting up to $t=(n-k)/2$ symbol errors in a received codeword. The RS decoding unit 120 may first determine whether the errors in the received codeword can be corrected. If the number of symbol errors is less than or equal to t, the RS decoding unit 120 may proceed to correct the errors. The RS decoding unit 120 may output the decoded codeword to the data sink 125. If the number of symbol errors is greater than t, the RS decoding unit 120 may indicate a decoding failure.

The RS encoder 110 and RS decoding unit 120 can contain one or more components, such as circuits or computer-executable instructions, that can be implemented in hardware, software, or some combination thereof. A number of hardware implementations may be used for the RS encoder and decoder. For example, integrated circuits (IC), VHDL, or Verilog designs, can be used to encode and decode Reed-Solomon codes. A logic core can be integrated with other VHDL or Verilog components and synthesized to an FPGA (Field Programmable Gate Array) or ASIC (Application Specific Integrated Circuit)—this enables so-called "System on Chip" designs where multiple modules can be combined in a single IC.

Figure 2:
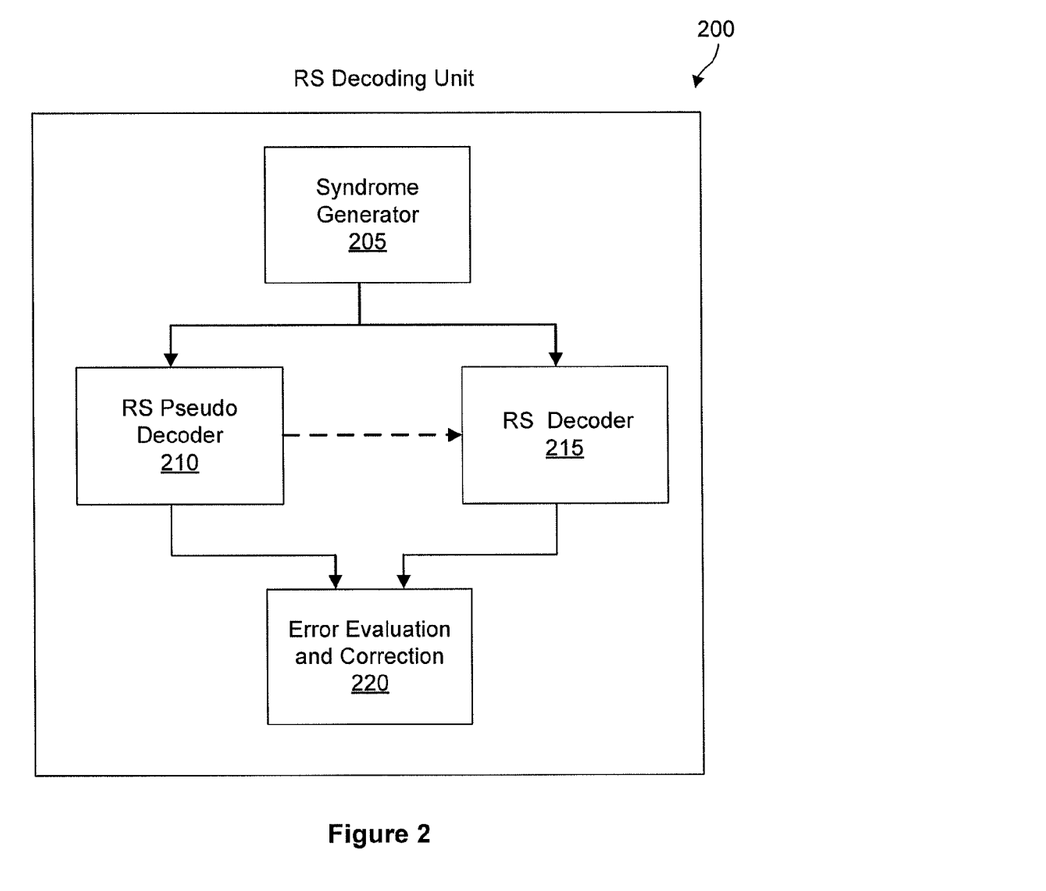
FIG. 2 illustrates a component diagram of an example RS decoding unit, in accordance with an embodiment of the present disclosure.

FIG. 2 illustrates a component diagram of an example RS decoding unit 200. The RS decoding unit 200 includes a syndrome generator 205, RS Pseudo Decoder 210, RS Decoder 215, and an Error Evaluation and Correction unit 220. A syndrome is used to identify errors in a received codeword. The syndrome generator 205 produces syndromes based on a received codeword. A Reed-Solomon codeword has (n−k) syndromes that depend on errors e(x). The syndromes $S_i$ can be calculated by substituting the (n−k) roots of the generator polynomial g(x) into the received polynomial r(x). The received codeword r(x) is the original codeword c(x) plus errors: r(x)=c(x)+e(x). The syndrome generation is equivalent to a Galois Field Fourier Transform that converts the time-domain data into the frequency domain. The received codeword can be expressed as: $r(x)=r_{n-1}x^{n-1}+r_{n-2}x^{n-2}+ \ldots +r_1 x+r_0$, where $r_i \in GF(2^m)$, i=0, ..., n−1. The following equations show the syndrome operations:

$$S(x) = S_1 + S_2 x + S_3 x^2 + \ldots + S_{2t} x^{2t-1},$$

$$S_i = \sum_{l=0}^{n-1} r_l \alpha^{l(b_0+i-1)}, i = 1, \ldots, 2t$$

While the syndrome generator 205 is shown as a separate module from the RS pseudo decoder 210 and the RS decoder 215, the syndrome generator may also be implemented as part of the RS pseudo decoder or the RS decoder.

The RS decoding unit 200 includes a RS pseudo decoder 210 and a RS decoder 215. The RS pseudo decoder 210 may receive computed syndrome values from the syndrome generator 205. The RS pseudo decoder is capable of correcting symbol errors up to a predetermined number less than t. For example, the RS pseudo decoder 210 may be able to correct a single symbol error or two consecutive symbol errors in a received codeword. The RS pseudo decoder 210 employs a non-iterative decoding algorithm based on the computed syndrome values, and may complete its decoding process in a short amount of time and/or with lower complexity compared with the RS decoder. The required time to decode the codeword by the RS pseudo decoder may be constant, independent of the number of symbol errors contained in the received codeword.

The RS pseudo decoder 210 may also interact with other components in the RS decoder, such as the RS decoder 215, the error evaluation and correction component 220, etc. For example, upon completion of the decoding, the RS pseudo decoder 210 may send an indication to the RS decoder 215, indicating a successful decoding of the received codeword. The RS pseudo decoder 210 may also send an indication to the RS decoder 215 when the RS pseudo decoder 210 is unable to decode the received codeword.

The RS decoder 215 is configured to fully correct symbol errors that are recoverable by the RS code, i.e., up to t symbol errors. The RS decoder 215 may receive computed syndrome values from the syndrome generator 205. The RS decoding solves 2t simultaneous equations, one for each syndrome. Iterative algorithms, such as the Berlekamp-Massey algorithm, may be used by the RS decoder. The process of solving the simultaneous equations is usually split into two stages. First, an error location polynomial is found. This polynomial has roots which give the error locations. Then the roots of the error polynomial are found. For example, the Berlekamp-Massey algorithm or Euclid's algorithm may be used by the RS decoder to find an error locator polynomial. The algorithm iteratively solves the error locator polynomial by solving one equation after another and updating the error locator polynomial. If it turns out that the equation cannot be solved at some step, then the algorithm computes the error and weights it, increases the size of the error polynomial, and performs another iteration. A maximum of 2t iterations are required. Once the error polynomial is known, its roots define where the errors are located in the received codeword. A Chien search algorithm may be used to find the roots of this polynomial. This is a brute force and exhaustive search method. All $2^m$ possible symbols are substituted into the error polynomial, one by one, and the polynomial is evaluated. If the result comes to zero, a root is found. Once the error location is found, the next step is to use the syndromes and the error polynomial roots to derive the error values. The Forney algorithm may be used to find the symbol error values.

The RS decoder 215 consumes a longer time than the RS pseudo decoder 210 because of the iterative steps required for the RS decoder 215 to decode the received codeword. The RS decoder 215 may be configured to receive an indication from the RS pseudo decoder 210. For example, if the RS decoder 215 receives an indication from the RS pseudo decoder 210 that the decoding is successfully performed by the RS pseudo decoder 210, the RS decoder 215 may abort its on-going decoding process, thereby saving its power consumption. In some implementations, the RS decoder 215 may start decoding the next codeword upon receiving the indication from the RS pseudo decoder 210 that the decoding is successfully performed by the RS pseudo decoder 210. For another example, if the RS decoder 215 receives an indication from the RS pseudo decoder 210 that the RS pseudo decoder 210 fails to perform the decoding, the RS decoder 215 may continue its decoding process until an output is generated.

Once the RS pseudo decoder 210 or the RS decoder 215 identifies locations and magnitudes of the error symbols, the RS pseudo decoder 210 and the RS decoder 215 may output the locations and magnitudes of the error symbols to the error evaluation and correction component 220. The error evaluation and correction component 220 may correct the identified errors in the received codeword and output the decoded message without the parity symbols. For example, the error evaluation and correction component 220 may derive the corrected codeword c(x) by removing the errors: c(x)=r(x)−e(x). While the error evaluation and correction component 220 is shown as a separate module from the RS pseudo decoder 210 and the RS decoder 215, the error evaluation and correction component may also be implemented as part of the RS pseudo decoder 210 or the RS decoder 215.

Figure 3:
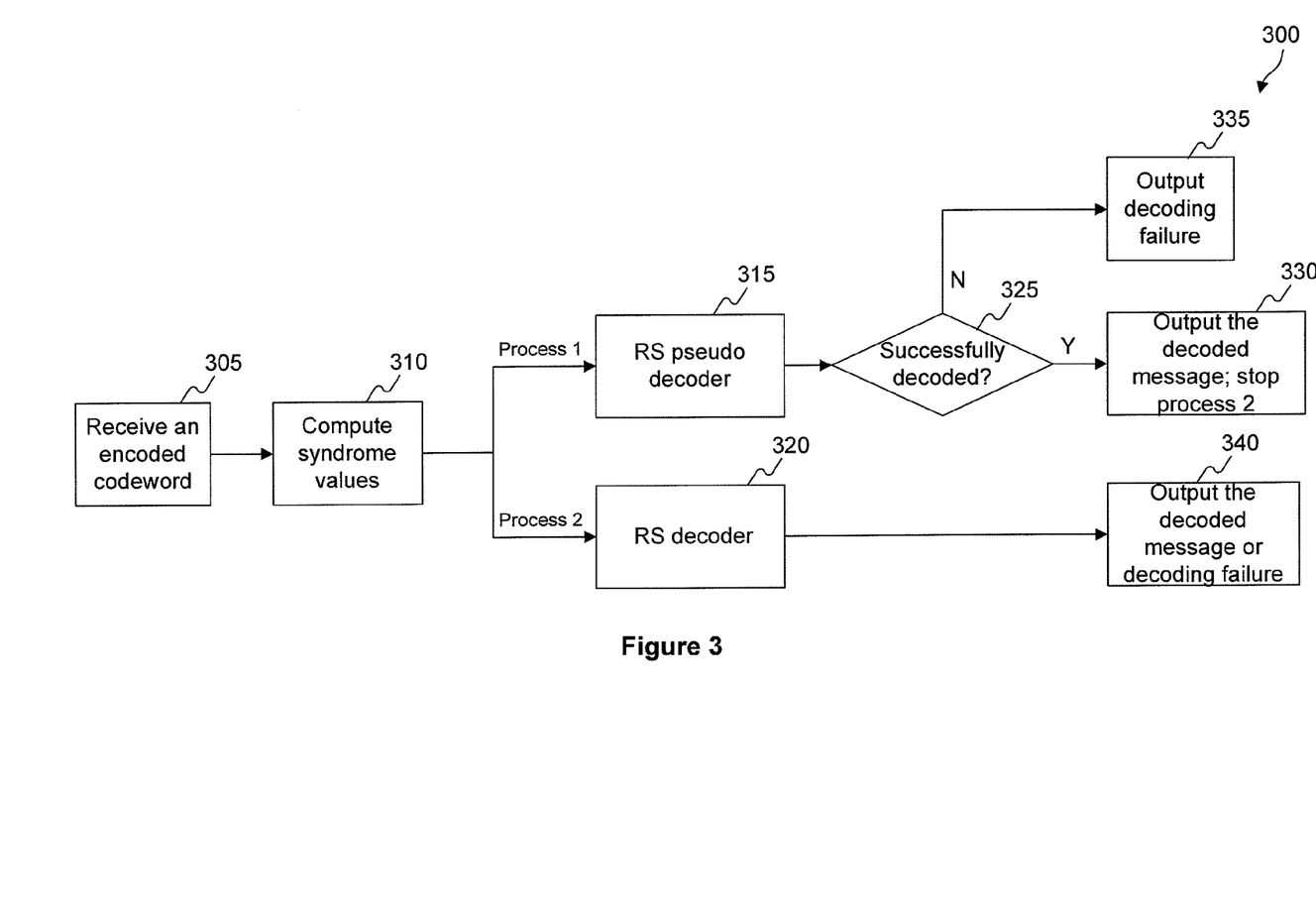
FIG. 3 illustrates an example method for performing RS decoding, in accordance with an embodiment of the present disclosure.

FIG. 3 illustrates an example method 300 for performing RS decoding by the RS decoding unit. The goal of the decoding unit is to find the number of errors, the positions of the errors, and the error values at those positions. From those, e(x) can be calculated and subtracted from r(x) to get the original message m(x). First, the RS decoding unit receives an encoded codeword r(x) at 305. The received codeword may be corrupted by noise or interference signals in the channel. The RS decoding unit computes syndrome values $S_i$ based on the received codeword at 310. For a RS (n, k) code, there are (n−k) syndrome values in total. The syndrome values may be calculated by the following equation: $S_i=\Sigma_{l=0}^{n-1} r_l \alpha^{(b_0+i-1)}$, i=1, . . . , 2t. In other words, the input received symbols are divided by the generator polynomial. The result should be zero if there are no errors. If there is a remainder, then there are errors in the received codeword. The remainder is called the syndrome. The syndromes depend only on the errors, not the underlying encoded data. If all of the syndromes are equal to zero, the received codeword does not contain any error. If any of the computed syndrome is not zero, it means that there is at least an error in the received codeword. The syndrome calculation may be done by an iterative process, such that the syndrome symbols are available as soon as the last parity symbol has been read in.

After computing the syndrome values, the RS decoding unit runs two parallel processes: process 1 performed by the RS pseudo decoder 315 and process 2 performed by the RS decoder 320. The RS pseudo decoder 315 is capable of correcting a limited number of errors, while the RS decoder 320 is capable of correcting up to t errors recoverable by the RS code. The RS pseudo decoder 315 employs a fast and non-iterative algorithm based on the computed syndrome values to detect and correct the small number of errors in the received codeword, while the RS decoder 320 employs a time-consuming iterative algorithm to detect and correct the errors. After the syndrome values are computed, the RS pseudo decoder 315 and the RS decoder 320 may each start a decoding process at a substantially same time.

Since the RS pseudo decoder 315 employs a faster algorithm than the RS decoder 320, the RS pseudo decoder 315 may finish its task while the RS decoder 320 is still in processing. The RS pseudo decoder 315 determines whether the received codeword is successfully decoded at 325. If the RS pseudo decoder 315 successfully decodes the received codeword, the RS pseudo decoder 315 may output the decoded message at 330. In the meantime, process 2 is stopped at 330 as it is unnecessary for the RS decoder 320 to continue decoding at this point. In some implementations, the RS pseudo decode 315 may alternatively output the location and magnitudes of the detected errors at 330 instead of outputting the decoded message. The RS pseudo decoder usually returns a result quicker than the RS decoder 320. By implementing the RS pseudo decoder 315, the RS decoding unit is able to finish the decoding process quickly if the number of errors in the received codeword is small.

On the other hand, if the RS pseudo decoder 315 is unable to decode the received codeword at 325, the RS pseudo decoder 315 may output decoding failure at 335. The RS decoder 320 will continue running until it outputs the decoded message or decoding failure at 340. Therefore, in situations where the RS pseudo decoder 315 is unable to decode, the RS decoding unit will rely on the powerful RS decoder 320 for decoding. In other words, the maximum decoding power of the RS decoding unit is maintained by the implementation of the RS decoder 320 while the RS pseudo decoder 315 is implemented to speed up the decoding process when the number of errors is small.

It should be noted that although the two processes are shown in parallel in FIG. 3, it is also possible to execute the two processes in sequential order without departing the scope of this disclosure. For example, the RS decoder 320 may start running after the RS pseudo decoder 315 indicates a failure to decode the received codeword. In some implementations, the RS decoder 320 may start running after the RS pseudo decoder 315 starts running for a predetermined time.

Figure 4:
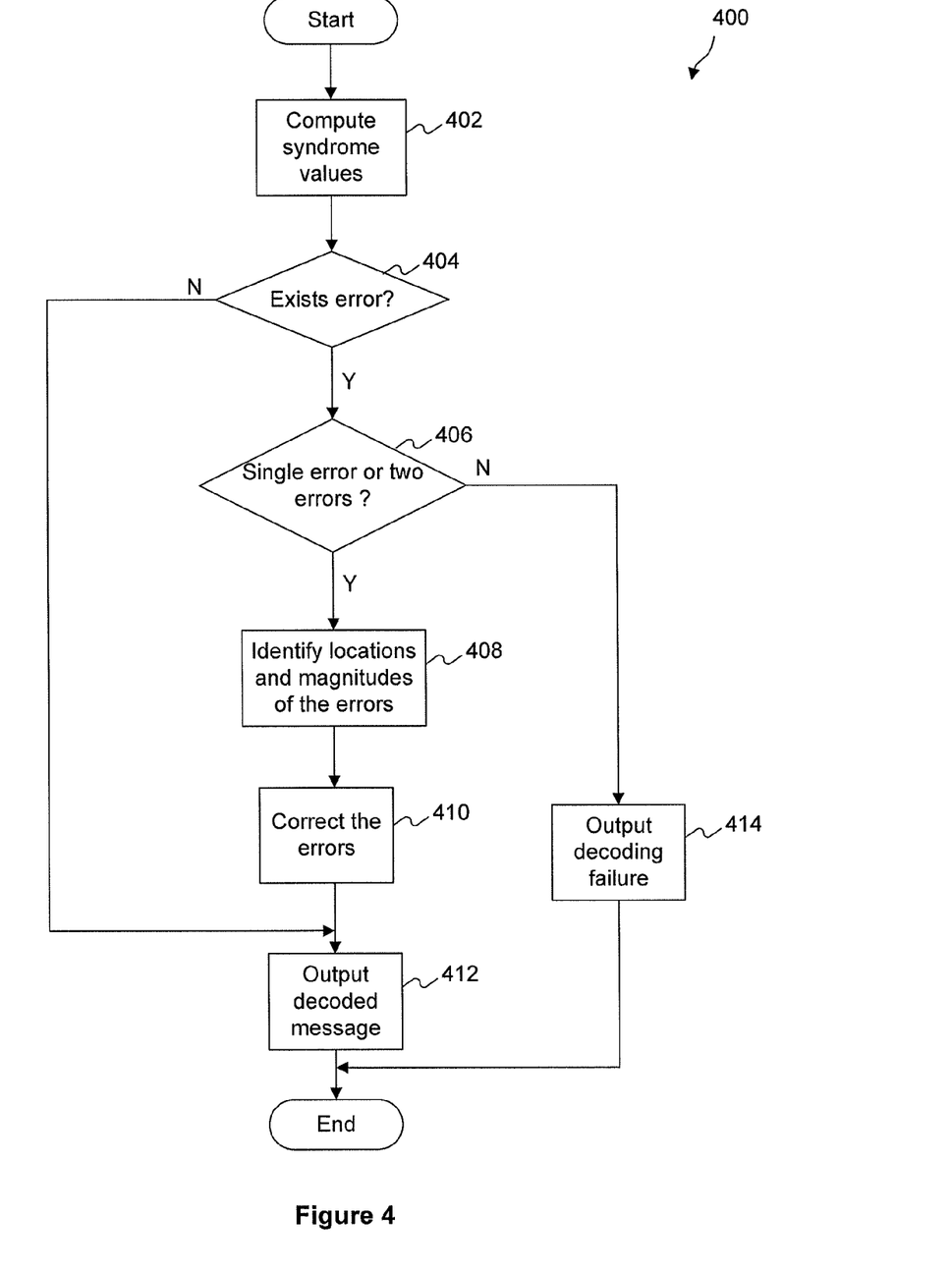
FIG. 4 illustrates an example method performed by a RS pseudo decoder, in accordance with an embodiment of the present disclosure.

FIG. 4 illustrates an example method 400 performed by the RS pseudo decoder, for example RS pseudo decoder 210. The RS pseudo decoder may compute syndrome values based on the received codeword at 402. Alternatively, the RS pseudo decoder may obtain the syndrome values from the other component in the RS decoder at 402. That is, the syndrome computing component may reside in the RS pseudo decoder or outside the RS pseudo decoder.

The RS pseudo decoder determines whether there exist errors in the received codeword at 404. For example, the RS pseudo decoder may check the syndrome values computed for the received codeword. If all the syndrome values are equal to zero, the RS pseudo decoder may determine that there is no error in the received codeword. Then, the RS pseudo decoder may proceed to output the decoded message at 412. On the other hand, if any of the syndrome values is not zero, the RS pseudo decoder may determine that there exist errors in the received codeword. In this case, the RS pseudo decoder proceeds to determine whether there exists a single error or two errors in the received codeword at 406. The RS pseudo decoder in this example is capable of correcting up to two errors in the received codeword. If the number of errors contained in the received codeword is less than or equal to two, the RS pseudo decoder may proceed to identify and correct the errors. If the number of errors contained in the received codeword is greater than two, the RS pseudo decoder may output a decoding failure at 414.

The RS pseudo decoder determines whether there exists a single error or two errors based on the syndrome values. The RS pseudo decoder may implement two parallel processes to check whether a single error or two errors exist. In some implementations, it is also possible for the RS pseudo decoder to first check whether a single error exists, and if not, proceed to check whether two errors exist in the received codeword.

The syndrome characteristics for a single error and two errors are different and will be explained hereafter. The syndrome values are equivalent to the Galois Field Fourier Transform of the errors: $S_i = E_i$, $i = 0, \ldots, n-k-1$, where $E_i$ denotes the frequency components of the errors, n denotes the number of encoded symbols in a block, and k denotes the number of original message symbols.

For a single symbol error, the error in time domain can be expressed as $e_j = \alpha^{V_1} \delta_{j-l_1}$, $j = 0, \ldots, n-k-1$, where $l_1$ denotes the location of the error symbol, and $V_1$ denotes the magnitude of the error. Equivalently, in the frequency domain, the syndrome values can be expressed as: $S_i = E_i = \alpha^{V_1 + l_1 \cdot i}$. It can be observed that the syndrome values satisfy a specific relationship with each other when a single error is contained in the received codeword. In particular, where there exists a single symbol error, the value of $S_0$ indicates the magnitude of the error, and the ratio of $S_1$ and $S_0$ indicates the location of the error, which can be expressed as follows:

$$V_1 = S_0,$$

$$\alpha^{l_1} = S_1/S_0$$

Where there exists a single symbol error, all the syndrome values should satisfy that:

$$S_i \cdot \alpha^{l_1} = S_{i+1} \quad (1)$$

Figure 5:
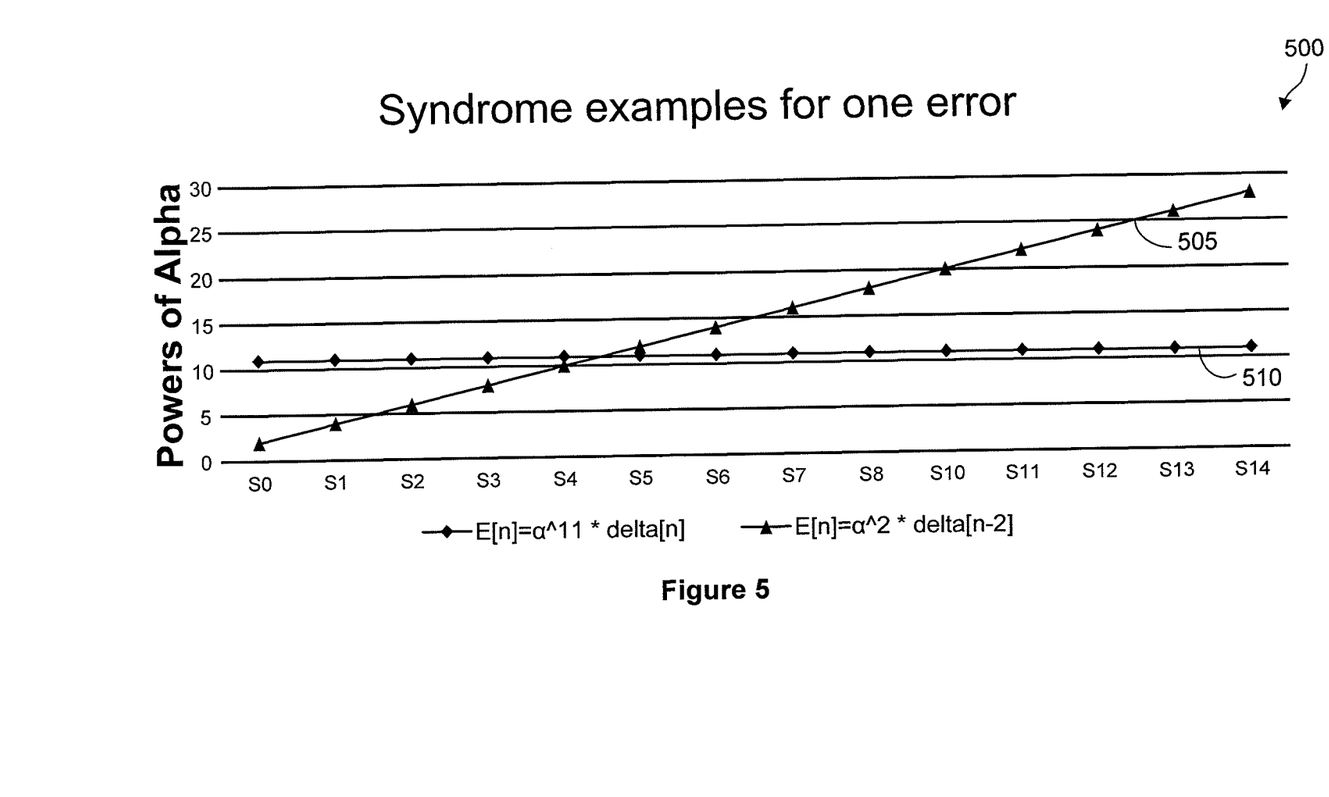
FIG. 5 illustrates an example plot of syndromes for a received RS codeword containing a single error consistent with the present disclosure.

In other words, the ratio of syndrome values between each neighbor syndrome is a constant. FIG. 5 illustrates an example plot of syndromes 500 for a received RS codeword with a single symbol error. The x-axis represents 15 different syndromes, and the y-axis represents the power values with respect to a for each syndrome. It can be seen from FIG. 5 that the syndrome values form a straight line when there is a single symbol error. Line 505 represents the syndromes when the location of the error symbol is at received symbol 2. Line 510 represents the syndromes when the location of the error symbol is at received symbol 0.

This specific characteristics of the syndrome values allows the RS pseudo decoder to quickly verify whether the received codeword contains a single symbol error. The RS pseudo decoder may check all the syndromes on whether the relationship: $S_i \cdot \alpha^{l_1} = S_{i+1}$ is satisfied for all syndromes. If any of the syndromes does not satisfy this relationship, the RS pseudo decoder will determine that the errors contained in the received codeword is not a single error.

When the received codeword contains two symbol errors, the syndromes exhibit a different kind characteristics. Let l denote the location of the first error and m denote the symbol distance between the errors. In the two error case, the following derivations apply: $S_0 = E_1 + E_2$, $S_1 = E_1 \alpha^l + E_2 \alpha^{l+m}$, $S_2 = E_1 \alpha^{2l} + E_2 \alpha^{(l+m)}$.

When there exists two errors with distance m in the received codeword, each of the syndromes should satisfy the following relationship:

$$(S_i)^2(\alpha^{2l})^2(\alpha^{2m}+1)^2 = (S_{i+1})^2(\alpha^{2l})(\alpha^{2m}+\alpha^m+1+\alpha^{-m})^2 + (S_{i+2})^2(\alpha^{-m}+\alpha^m)^2 \quad (2)$$

Referring back to FIG. 4, the RS pseudo decoder checks whether the received codeword contains a single error or two errors at 406 by applying equation (1) and (2) respectively. If equation (1) is satisfied for all syndromes, the RS pseudo decoder determines that the received codeword contains a single error. If equation (2) is satisfied for all syndromes, the RS pseudo decoder determines that the received codeword contains two errors. In some implementations, the RS pseudo decoder may assume that the distance between the two errors to be 1 symbol, i.e., the two errors are consecutive (m=1), and apply equation (2) subsequently. If neither of equation (1) or (2) is satisfied, the RS pseudo decoder may determine that the received codeword contains more than two errors and indicate a decoding failure at 414.

If the received codeword contains a single error or two errors, the RS pseudo decoder may proceed to identify the locations and magnitudes of the errors at 408. For example, in the single error case, the error location $l_1$ may be identified by the ratio of $S_1$ and $S_0$. In particular, $\alpha^{l_1} = S_1/S_0$. The magnitude $V_1$ of the single error is equal to the value of $S_0$: $V_1 = S_0$. Therefore, the error location and magnitude of the single error can be calculated based on the syndrome values as above.

In the case of two errors, the location of the first error l can be calculated by the following equations. Note that the second error has a distance of m with the first error, and m is known to the RS pseudo decoder.

$$\alpha^{2l} = \frac{\tau_2}{\tau_1}$$

$$\tau_1 = ((S_0 S_2) + (S_1)^2)(1 + \alpha^{2m})^{-1}$$

$$\tau_2 = ((S_0 S_4) + (S_2)^2)(1 + \alpha^{4m})^{-1}$$

The magnitudes of the two errors can be calculated as follows:

$$z = \frac{S_2}{\alpha^{2l}}$$

$$E_2 = (z + S_0) \cdot (1 + \alpha^{2m})^{-1}$$

$$E_1 = (z + S_0 \alpha^{2m}) \cdot (1 + \alpha^{2m})^{-1}$$

In some implementations, the RS pseudo decoder may identify the locations and magnitudes of the errors while it is checking whether a single error or two errors exist in the received codeword. The RS pseudo decoder may also first identify the locations and magnitudes of the errors using the above-described equations and then verify whether the received codeword contains a single error or two errors.

After the RS pseudo decoder identifies the locations and magnitudes of the errors, the RS pseudo decoder proceeds to correct the identified errors at 410. For example, the RS pseudo decoder may subtract the errors from the received codeword. The RS pseudo decoder may subsequently output the decoded message at 412.

By implementing the RS pseudo decoder in the RS decoding unit, the RS decoding latency can be greatly reduced. The RS pseudo decoder takes advantage of the characteristics of the syndrome values, and is able to detect and correct a small number of errors in a short amount of time and/or with lower complexity.

The systems and methods described above may be implemented by any hardware, software or a combination of hardware and software having the above described functions. The software code, either in its entirety or a part thereof, may be stored in a computer readable memory.

While several implementations have been provided in the present disclosure, it should be understood that the disclosed systems and methods may be implemented in many other specific forms without departing from the scope of the present disclosure. The present examples are to be considered as illustrative and not restrictive, and the intention is not to be limited to the details given herein. For example, the various elements or components may be combined or integrated in another system or certain features may be omitted, or not implemented.

Also, techniques, systems, subsystems and methods described and illustrated in the various implementations as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

While the above detailed description has shown, described, and pointed out the fundamental novel features of the disclosure as applied to various implementations, it will be understood that various omissions and substitutions and changes in the form and details of the system illustrated may be made by those skilled in the art, without departing from the intent of the disclosure.

What is claimed is:

1. A method for error-correction decoding, comprising:
   receiving an encoded codeword;
   computing one or more syndrome values based on the received codeword;
   performing, on the received codeword and the one or more syndrome values, a first decoding process using a first decoder, wherein the first decoder is configured to identify no more than a predetermined number of errors, wherein the first decoder is configured to use a non-iterative decoding algorithm based on the one or more syndrome values, and wherein the first decoder is configured to, when the received codeword contains a single error, identify a location of an error symbol based on a ratio between two syndrome values, and when the received codeword contains two errors in adjacent symbols, identify a location l of one of the two error symbols by calculating $$a^{2l} = \frac{\tau_2}{\tau_1},$$

wherein $\tau_1 = ((S_0 S_2) + (S_1)^2)(1 + \alpha^{2m})^{-1}$, $\tau_2 = ((S_0 S_4) + (S_2)^2)(1 + \alpha^{4m})^{-1}$, $S_0, S_1, S_2$ and $S_4$ are syndrome values, $\alpha$ is a primitive element, and m is a distance between the two error symbols; and
   performing, on the received codeword and in parallel with the first decoding process, a second decoding process using a second decoder, the second decoder configured to identify more than the predetermined number of errors, wherein the second decoder uses an iterative decoding algorithm based on the one or more syndrome values.

2. The method of claim 1, further comprising:
   generating a decoded message by the first decoding process; and
   aborting the second decoding process.

3. The method of claim 1, further comprising generating a decoded message by the second decoding process, wherein the first decoding process determines that the received codeword includes more than the predetermined number of errors.

4. The method of claim 1, wherein the first decoder is a Reed-Solomon (RS) pseudo decoder and the second decoder is an RS decoder.

5. The method of claim 1, wherein the first decoder identifies one or two errors associated with the received codeword based on the one or more syndrome values.

6. The method of claim 1, wherein the first decoding process consumes less time than the second decoding process.

7. The method of claim 1, wherein the second decoder is based on a Berlekamp-Massey algorithm.

8. The method of claim 1, wherein the first decoder and the second decoder are integrated in a single chip.

9. The method of claim 1, further comprising:
   generating a decoded message by the first decoding process; and
   starting decoding another received codeword.

10. An error-correction decoding unit comprising:
    a first decoder for performing a first decoding process based on a received codeword, wherein the first decoder is configured to identify no more than a predetermined number of errors, wherein the first decoder is configured to use a non-iterative decoding algorithm based on one or more syndrome values computed based on the received codeword, and wherein the first decoder is configured to, when the received codeword contains a single error, identify a location of an error symbol based on a ratio between two syndrome values, and when the received codeword contains two errors in adjacent symbols, identify a location l of one of the two error symbols by calculating $$a^{2l} = \frac{\tau_2}{\tau_1},$$

wherein $\tau_1 = ((S_0 S_2) + (S_1)^2)(1 + \alpha^{2m})^{-1}$, $\tau_2 = ((S_0 S_4) + (S_2)^2)(1 + \alpha^{4m})^{-1}$, $S_0, S_1, S_2$, and $S_4$ are syndrome values, $\alpha$ is a primitive element, and m is a distance between the two error symbols; and a second decoder for performing a second decoding process based on the received codeword, the second decoder configured to identify more than the predetermined number of errors, wherein the first decoder performs the first decoding process in parallel with the second decoder performing the second decoding process, and wherein the second decoder uses an iterative decoding algorithm based on the one or more syndrome values.

11. The decoding unit of claim 10, wherein the first decoder is a Reed-Solomon (RS) pseudo decoder and the second decoder is an RS decoder.

12. The decoding unit of claim 10, wherein the first decoding process generates a decoded message and the second decoding process is aborted.

13. The decoding unit of claim 10, wherein the first decoding process determines that the received codeword includes more than the predetermined number of errors and the second decoding process generates a decoded message.

14. The decoding unit of claim 10, wherein the first decoder identifies one or two errors associated with the received codeword based on the one or more syndrome values.

15. The decoding unit of claim 10, wherein the first decoding process consumes less time than the second decoding process.

16. The decoding unit of claim 10, wherein the second decoder is based on a Berlekamp-Massey algorithm.

17. The decoding unit of claim 10, wherein the first decoder and the second decoder are integrated in a single chip.

18. The decoding unit of claim 10, wherein the first decoding process generates a decoded message, and the decoding unit starts decoding another received codeword.

* * * * *